(12) United States Patent
Wei et al.

(10) Patent No.: US 11,099,092 B2
(45) Date of Patent: Aug. 24, 2021

(54) PRESSURE DETECTION CHIP AND METHOD FOR DETECTION PRESSURE

(71) Applicant: SHENZHEN GOODIX TECHNOLOGY CO., LTD., Shenzhen (CN)

(72) Inventors: Haijun Wei, Shenzhen (CN); Tujiang Chen, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 222 days.

(21) Appl. No.: 16/449,375

(22) Filed: Jun. 22, 2019

(65) Prior Publication Data

US 2019/0310154 A1 Oct. 10, 2019

Related U.S. Application Data

(63) Continuation of application No. PCT/CN2018/078677, filed on Mar. 12, 2018.

(51) Int. Cl.
*G01L 19/00* (2006.01)
*G06F 3/041* (2006.01)
(Continued)

(52) U.S. Cl.
CPC .......... *G01L 19/0092* (2013.01); *G01L 9/003* (2013.01); *G01L 19/0061* (2013.01);
(Continued)

(58) Field of Classification Search
CPC . G01L 19/0092; G01L 19/0061; G01L 1/144; G01L 1/26; G06F 3/0414;
(Continued)

(56) References Cited

U.S. PATENT DOCUMENTS 8,711,120 B2\* 4/2014 Hargreaves ........... G06F 3/0443
345/173
9,218,089 B2 12/2015 Yamaguchi
(Continued)

FOREIGN PATENT DOCUMENTS

CN 103914197 A 7/2014
CN 105930019 A 9/2016
(Continued)

*Primary Examiner* — Jonathan M Dunlap (57) ABSTRACT

A pressure detection chip and a method for detection pressure are disclosed. The method is executed by a pressure detection apparatus including a cancellation circuit and a coupling circuit in parallel; the coupling circuit includes a variable capacitance component having a first electrode layer and a second electrode layer. The method for detection pressure includes: inputting a first input signal to the cancellation circuit and outputting a first output signal; and inputting a second input signal to the coupling circuit and outputting a second input signal, where the first input signal and the second input signal are 180 degrees out of phase, and the first output signal is configured to cancel the second output signal; and determining whether the first electrode layer is subjected to the touch pressure, according to the first output signal and the second output signal.

20 Claims, 3 Drawing Sheets

(51) Int. Cl.
*G01L 9/00* (2006.01)
*H03K 17/975* (2006.01)
*G01L 1/14* (2006.01)
*G01L 1/26* (2006.01)
*G06F 3/044* (2006.01)

(52) U.S. Cl.
CPC ............ *G06F 3/0414* (2013.01); *G01L 1/144* (2013.01); *G01L 1/26* (2013.01); *G06F 3/041* (2013.01); *G06F 3/0418* (2013.01); *G06F 3/0447* (2019.05); *G06F 2203/04105* (2013.01); *G06F 2203/04106* (2013.01); *H03K 17/975* (2013.01)

(58) Field of Classification Search
CPC ...... G06F 3/0418; G06F 3/0447; G06F 3/041; G06F 2203/04106; G06F 2203/04105; H03K 17/975
See application file for complete search history.

(56) References Cited

U.S. PATENT DOCUMENTS

| | | | |
|---|---|---|---|
| 9,582,123 B2 * | 2/2017 | Tiruvuru | G06F 3/044 |
| 9,639,733 B2 * | 5/2017 | Kremin | G06K 9/0002 |
| 9,910,535 B2 | 3/2018 | Kitada et al. | |
| 10,055,060 B2 | 8/2018 | Lee et al. | |
| 10,068,121 B2 * | 9/2018 | Kremin | G06F 3/0446 |
| 10,229,304 B2 * | 3/2019 | Shen | G06K 9/0002 |
| 10,444,870 B2 * | 10/2019 | Kadowaki | G06F 3/03545 |
| 10,657,350 B2 * | 5/2020 | Shen | G06K 9/0002 |
| 2014/0015746 A1 * | 1/2014 | Hargreaves | G06F 3/0383 345/157 |
| 2014/0145997 A1 * | 5/2014 | Tiruvuru | G06F 3/04182 345/174 |
| 2014/0192015 A1 | 7/2014 | Yamaguchi et al. | |
| 2016/0148034 A1 * | 5/2016 | Kremin | G06K 9/00033 382/124 |
| 2016/0195994 A1 | 7/2016 | Kitada et al. | |
| 2016/0358003 A1 * | 12/2016 | Shen | G06K 9/0002 |
| 2017/0038868 A1 | 2/2017 | Tai et al. | |
| 2017/0061188 A1 * | 3/2017 | Kremin | G06F 3/0418 |
| 2017/0097730 A1 | 4/2017 | Pan et al. | |
| 2017/0160866 A1 | 6/2017 | Tsai | |
| 2017/0277351 A1 | 9/2017 | Lee et al. | |
| 2017/0315650 A1 | 11/2017 | Reynolds | |
| 2017/0315662 A1 | 11/2017 | Reynolds et al. | |
| 2019/0042043 A1 | 2/2019 | Wang et al. | |
| 2019/0146602 A1 * | 5/2019 | Kadowaki | G06F 3/03545 345/174 |

FOREIGN PATENT DOCUMENTS

| | | |
|---|---|---|
| CN | 106054433 A | 10/2016 |
| CN | 106445220 A | 2/2017 |
| CN | 106855760 A | 6/2017 |
| CN | 107229366 A | 10/2017 |
| CN | 107479776 A | 12/2017 |
| WO | 2015046289 A1 | 4/2015 |

* cited by examiner

PRESSURE DETECTION CHIP AND METHOD FOR DETECTION PRESSURE

CROSS REFERENCE TO RELATED APPLICATIONS

The present disclosure is a continuation of international application No. PCT/CN2018/078677, filed on Mar. 12, 2018, of which is hereby incorporated by reference in its entirety.

TECHNICAL FIELD

The present application relates to the field of electronic technologies, and in particular, relates to a pressure detection chip and a method for detection pressure.

BACKGROUND

A wave of changes in a mobile phone display brings a capacitive touch screen. Now, as smartphone manufacturers introduce a display screen with a new aspect ratio and a new design of a rimless full screen, a display area can be maximized and even a design of 100% screen-to-body ratio is pursued without increasing an overall size of the mobile phone, which greatly enhances user experience of a smartphone. However, these new forms of display can cause that there is no position for a physical Home key on the mobile phone display screen. Thus, it is a necessity to consider for the smartphone manufacturers to find an alternative solution of the Home key.

At present, there are a variety of common alternative solutions for the Home key. One alternative solution is to arrange a variable pressure sensor under a screen body, and to detect existence of pressure or detect a change characteristic of a pressure by the variable pressure sensor to jointly determine whether to trigger a Home key event. Such solution can save space and avoid a false trigger. However, if a finger pressure signal is extremely weak when it reaches the pressure sensor after penetrating a glass cover of the mobile phone, there is a problem that detection sensitivity is insufficient.

SUMMARY

The present application provides a pressure detection chip and a method for detection pressure, which could improve sensitivity of pressure detection.

In a first aspect, a pressure detection chip is provided, including: a cancellation circuit, a driving unit and a processing unit, where the cancellation circuit is connected in parallel with a coupling circuit; the coupling circuit includes a variable capacitance component; the variable capacitance component includes a first electrode layer and a second electrode layer; a distance between the first electrode layer and the second electrode layer changes when the first electrode layer is subjected to a touch pressure; a capacitance value of the variable capacitance component changes with a change of the distance between the first electrode layer and the second electrode layer.

Specifically, the driving unit is configured to: output a first input signal to the cancellation circuit, and output a second input signal to the coupling circuit, where the coupling circuit receives the second input signal and output a second output signal; the cancellation circuit is configured to: receive the first input signal and output a first output signal, the first input signal and the second input signal are 180 degrees out of phase, and the first output signal is configured to cancel the second output signal; and the processing unit is configured to: determine whether the first electrode layer is subjected to the touch pressure according to the first output signal and the second output signal.

Combined with the first aspect, in an implementation manner of the first aspect, the cancellation circuit includes a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

Combined with the first aspect and the above implementation manner, in another implementation manner of the first aspect, the pressure detection chip further includes: an amplifying circuit; both an output end of the cancellation circuit and an output end of the coupling circuit connect to an input end of the amplifying circuit; and the amplifying circuit is configured to: amplify the first output signal and the second output signal.

Combined with the first aspect and the above implementation manner, in another implementation manner of the first aspect, the first input signal is obtained by inverting a phase of the second input signal by 180 degrees.

Thus, the pressure detection chip of the embodiment of the present application could cancel most or all of the signals of the coupling circuit by setting the cancellation circuit when there is no touch pressure applied; as such if there is the touch pressure applied, and an amplification factor of the amplifier is unchanged, due to a cancellation effect of the cancellation circuit, an effective signal output by the coupling circuit could be multiplied, that is, the detection sensitivity is improved, so that the pressure detection is more accurate.

In a second aspect, a pressure detection apparatus is provided, including: a pressure detection chip and a first coupling circuit, where the pressure detection chip includes a first cancellation circuit, a driving unit and a processing unit; the first cancellation circuit is connected in parallel with the first coupling circuit; the first coupling circuit includes a variable capacitance component; the variable capacitance component includes a first electrode layer and a second electrode layer; a distance between the first electrode layer and the second electrode layer changes when the first electrode layer is subjected to a touch pressure; and a capacitance value of the variable capacitance component changes with a change of the distance between the first electrode layer and the second electrode layer.

Specifically, the driving unit is configured to: output a first input signal to the first cancellation circuit, and output a second input signal to the first coupling circuit; the first cancellation circuit is configured to: receive the first input signal and output a first output signal; the first coupling circuit is configured to: receive the second input signal and output a second output signal, where the first input signal and the second input signal are 180 degrees out of phase, and the first output signal is configured to cancel the second output signal; and the processing unit is configured to: determine whether the first electrode layer is subjected to the touch pressure according to the first output signal and the second output signal.

Combined with the second aspect, in an implementation manner of the second aspect, the cancellation circuit includes a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

Combined with the second aspect and the above implementation manner, in another implementation manner of the second aspect, the pressure detection chip further includes: an amplifying circuit; both an output end of a cancellation circuit and an output end of a coupling circuit connect to an input end of the amplifying circuit; and the amplifying circuit is configured to amplify the first output signal and the second output signal.

Combined with the second aspect and the above implementation manner, in another implementation manner of the second aspect, the first input signal is obtained by inverting a phase of the second input signal by 180 degrees.

Combined with the second aspect and the above implementation manner, in another implementation manner of the second aspect, the processing unit is specifically configured to: determine the first electrode layer is not subjected to the touch pressure if a difference signal between the first output signal and the second output signal is less than or equal to a first preset value.

Combined with the second aspect and the above implementation manner, in another implementation manner of the second aspect, the processing unit is specifically configured to: determine the first electrode layer is subjected to the touch pressure if the difference signal between the first output signal and the second output signal is greater than the first preset value.

Combined with the second aspect and the above implementation manner, in another implementation manner of the second aspect, the pressure detection chip further includes a second cancellation circuit; the pressure detection apparatus further includes a second coupling circuit; the second cancellation circuit is connected in parallel with the second coupling circuit; an input signal of the second cancellation circuit and an input signal of the second coupling circuit are 180 degrees out of phase; and an output signal of the second cancellation circuit is configured to cancel an output signal of the second coupling circuit.

Combined with the second aspect and the above implementation manner, in another implementation manner of the second aspect, a difference signal between the first output signal and the second output signal is a first difference signal, a different signal between the output signal of the second cancellation circuit and the output signal of the second coupling circuit is a second difference signal, and the first difference signal is greater than or equal to the second difference signal; the processing unit is specifically configured to: determine the first electrode layer is not subjected to the touch pressure if the first difference signal is greater than a first preset value, and a difference signal between the first different signal and the second different signal is less than or equal to a second preset value; or determine the first electrode layer is subjected to the touch pressure if the first difference signal is greater than the first preset value, and the difference signal between the first difference signal and the second difference signal is greater than the second preset value.

Combined with the second aspect and the above implementation manner, in another implementation manner of the second aspect, the processing unit is further configured to: determine a pressure characteristic of the touch pressure, if it determines that the first electrode layer is subjected to the touch pressure.

Thus, the pressure detection apparatus of the embodiment of the present application may include the cancellation circuit, and cancel most or all of the signals of the corresponding coupling circuit when there is no touch pressure applied; as such if there is the touch pressure applied, and an amplification factor of the amplifier is unchanged, due to a cancellation effect of the cancellation circuit, an effective signal output by the coupling circuit could be multiplied, that is, the detection sensitivity is improved, so that the pressure detection is more accurate. In addition, a pressure detection apparatus of the embodiment of the present application implements pressure detection by applying a micro capacitance detecting technology, which in principle belongs to the same type of signal detecting technology as the widely used capacitive touch detection at present, and could be reused with a capacitive touch IC. It could save both internal space of a mobile phone and financial costs.

Moreover, the pressure detection apparatus may include a plurality of pressure detecting circuits. Each pressure detecting circuit includes the coupling circuit and the cancellation circuit. The plurality of pressure detecting circuits could simultaneously detect a pressure signal, part of which could be used as an auxiliary to determine temperature drift and anti-interference processing, and could greatly improve application performance.

In a third aspect, a terminal device is provided, including: the pressure detection apparatus in the foregoing second aspect and each possible implementation of the second aspect.

Combined with the third aspect, in an implementation manner of the third aspect, the terminal device is configured to: trigger a target event corresponding to the touch pressure, if the pressure detection apparatus detects the touch pressure.

In a fourth aspect, a method for detection pressure is provided; the method is performed by a pressure detection apparatus; the pressure detection apparatus includes a cancellation circuit and a coupling circuit, where the cancellation circuit is connected in parallel with the coupling circuit; the coupling circuit includes a variable capacitance component; the variable capacitance component includes a first electrode layer and a second electrode layer; a distance between the first electrode layer and the second electrode layer changes when the first electrode layer is subjected to a touch pressure; a capacitance value of the variable capacitance component changes with a change of the distance between the first electrode layer and the second electrode layer.

The method includes: inputting a first input signal to the cancellation circuit, and outputting a first output signal via the cancellation circuit; inputting a second input signal to the coupling circuit, and outputting a second output signal via the coupling circuit, where the first input signal and the second input signal are 180 degrees out of phase, and the first output signal is configured to cancel the second output signal; and determining whether the first electrode layer is subjected to the touch pressure according to the first output signal and the second output signal.

Combined with the fourth aspect, in an implementation manner of the fourth aspect, the cancellation circuit includes a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

Combined with the fourth aspect and the above implementation manner, in another implementation manner of the fourth aspect, before the determining whether the first electrode layer is subjected to the touch pressure according to the first output signal and the second output signal, the method further includes: amplifying the first output signal and the second output signal.

Combined with the fourth aspect and the above implementation manner, in another implementation manner of the fourth aspect, the first input signal is obtained by inverting a phase of the second input signal by 180 degrees.

Combined with the fourth aspect and the above implementation manner, in another implementation manner of the fourth aspect, the determining whether the first electrode layer is subjected to the touch pressure according to the first output signal and the second output signal, includes: determining the first electrode layer is not subjected to the touch pressure if a difference signal between the first input signal and the second output signal is less than or equal to a first preset value.

Combined with the fourth aspect and the above implementation manner, in another implementation manner of the fourth aspect, the determining whether the first electrode layer is subjected to the touch pressure according to the first output signal and the second output signal, includes: determining the first electrode layer is subjected to the touch pressure if the difference signal between the first input signal and the second output signal is greater than the first preset value.

Combined with the fourth aspect and the above implementation manner, in another implementation manner of the fourth aspect, the pressure detection apparatus further includes a second cancellation circuit and a second coupling circuit; the second cancellation circuit is connected in parallel with the second coupling circuit; an input signal of the second cancellation circuit and an input signal of the second coupling circuit are 180 degrees out of phase; and an output signal of the second cancellation circuit is configured to cancel an output signal of the second coupling circuit.

Combined with the fourth aspect and the above implementation manner, in another implementation manner of the fourth aspect, a difference signal between the first output signal and the second output signal is a first difference signal, a different signal between the output signal of the second cancellation circuit and the output signal of the second coupling circuit is a second difference signal, and the first difference signal is greater than or equal to the second difference signal; and the determining whether the first electrode layer is subjected to the touch pressure according to the first output signal and the second output signal, includes: determining the first electrode layer is not subjected to the touch pressure if the first difference signal is greater than a first preset value, and a difference signal between the first different signal and the second different signal is less than or equal to a second preset value; or determining the first electrode layer is subjected to the touch pressure if the first difference signal is greater than the first preset value, and the difference signal between the first difference signal and the second difference signal is greater than the second preset value.

Combined with the fourth aspect and the above implementation manner, in another implementation manner of the fourth aspect, the method further includes: determining a pressure characteristic of the touch pressure, if determining that the first electrode layer is subjected to the touch pressure.

Thus, the method for detection pressure of the embodiment of the present application sets the cancellation circuit in the pressure detection apparatus. Most or all of the signals of the coupling circuit can be cancelled when there is no touch pressure applied; as such if there is the touch pressure applied, and an amplification factor of the amplifier is unchanged, due to a cancellation effect of the cancellation circuit, an effective signal output by the coupling circuit can be multiplied, that is, the detection sensitivity is improved, so that the pressure detection is more accurate. In addition, a pressure detection apparatus of the embodiment of the present application implements pressure detection by applying a micro capacitance detecting technology, which in principle belongs to the same type of signal detecting technology as the widely used capacitive touch detection at present, and can be reused with a capacitive touch IC. It can save both internal space of a mobile phone and financial costs.

Moreover, the pressure detection apparatus may include a plurality of pressure detecting circuits. Each pressure detecting circuit includes the coupling circuit and the cancellation circuit. The plurality of pressure detecting circuits can simultaneously detect a pressure signal, part of which can be used as an auxiliary to determine temperature drift and anti-interference processing, and can greatly improve application performance.

In a fifth aspect, a pressure detection apparatus is provided, including: a memory and a processor. The memory is configured to store an instruction, and the processor is configured to execute the instruction stored by the memory. When the processor executes the instruction stored by the memory, the execution causes the processor execute the method of the fourth aspect or any possible implementation of the fourth aspect.

In a sixth aspect, a computer readable medium is provided for storing a computer program, and the computer program includes an instruction for performing the method of the fourth aspect or any possible implementation of the fourth aspect.

In a seventh aspect, a computer program product is provided including an instruction, where when a computer runs the instruction of the computer program product, the computer performs the method for pressure detection in the foregoing fourth aspect or any possible implementation of the fourth aspect. Specifically, the computer program product may be run on the pressure detection apparatus of the foregoing fifth aspect.

DESCRIPTION OF EMBODIMENTS

The technical solutions in embodiments of the present application will be described hereinafter in conjunction with the attached drawings.

Figures 1, 2:
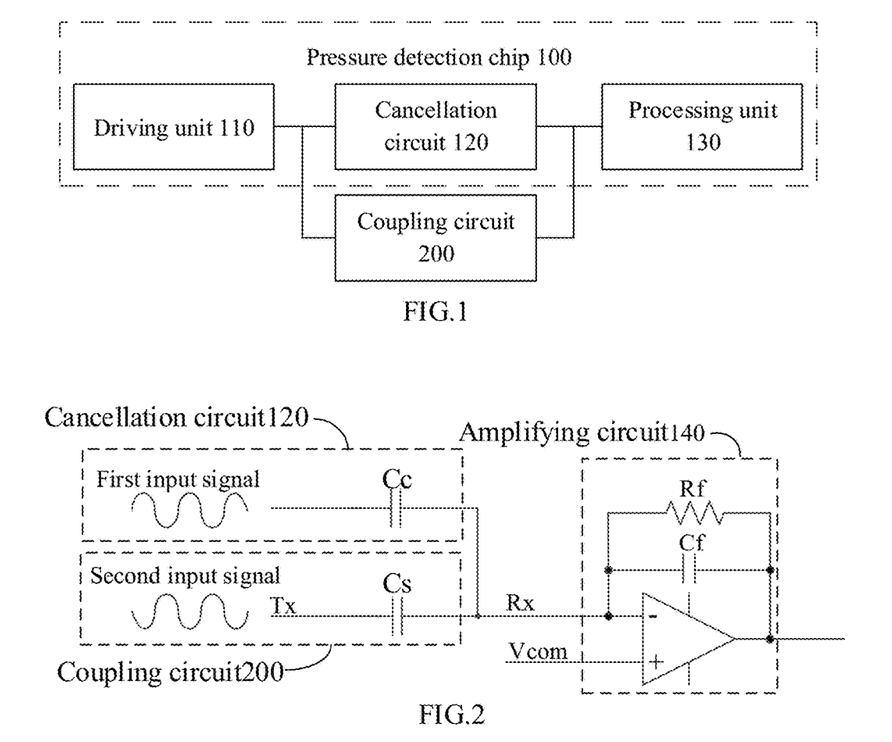
FIG. 1 is a schematic diagram of a pressure detection chip according to one embodiment of the present application.
FIG. 2 is another schematic diagram of a pressure detecting circuit according to one embodiment of the present application.

FIG. 1 shows a schematic diagram of a pressure detection chip 100 according to one embodiment of the present application. As shown in FIG. 1, the pressure detection chip 100 may include a driving unit 110, a cancellation circuit 120 and a processing unit 130, where the cancellation circuit 120 is connected in parallel with a coupling circuit 200. Specifically, the coupling circuit 200 may further include a variable capacitance component; and the variable capacitance component can be equivalent to a capacitor. The variable capacitance component includes a first electrode layer and a second electrode layer. A distance between the first electrode layer and the second electrode layer may change when the first electrode layer is subjected to a touch pressure. Similarly, a capacitance value of the variable capacitance component changes with a change of the distance between the first electrode layer and the second electrode layer.

Specifically, the driving unit 110 is configured to: output a first input signal to the cancellation circuit 120 and output a second input signal to the coupling circuit 200; the cancellation circuit 120 is configured to receive the first input signal and output a first output signal; similarly, the coupling circuit 200 is configured to receive the second input signal and output a second output signal, where the first input signal and the second input signal are 180 degrees out of phase, and the first output signal is configured to cancel the second output signal. For example, the first output signal can be configured to cancel all or almost all of the second output signal when the first electrode layer is not subjected to the touch pressure. In addition, the first output signal and the second output signal are configured to determine whether the first electrode layer is subjected to the touch pressure.

In the embodiment of the present application, FIG. 2 shows a schematic diagram of a pressure detecting circuit according to one embodiment of the present application. As shown in FIG. 2, the pressure detecting circuit may be taken as an embodiment of the above pressure detection chip 100 and the coupling circuit 200, where the pressure detecting circuit includes a cancellation circuit 120 and a coupling circuit 200.

Optionally, the pressure detecting circuit may further include an amplifying circuit 140. For example, the pressure detection chip 100 includes the amplifying circuit 140. An input end of the amplifying circuit 140 connects to an output end of the cancellation circuit 120 and an output end of the coupling circuit 200. The amplifying circuit 140 can be configured to amplify output signals of the cancellation circuit 120 and the coupling circuit 200, so that the amplifying circuit 140 can amplify a detection result, and determining whether the first electrode layer of the variable capacitance component in the coupling circuit 200 is subjected to a touch pressure according to the amplified result.

Optionally, the amplifying circuit 140 may include an amplifier, and may further include other relative circuits, but an embodiment of the present application is not limited to this.

Taking FIG. 2 as an example, an input signal of the cancellation circuit 120 is a first input signal, and a first output signal is outputted via the cancellation circuit 120. For example, the first input signal can be output to the cancellation circuit 120 via a driving unit 110. Optionally, the cancellation circuit 120 may include a preset capacitor Cc, and a capacitance value of the preset capacitor Cc may be a preset fixed value.

An input signal of the coupling circuit 200 is a second input signal, and a second output signal is outputted via the coupling circuit 200. For example, the second input signal can be output to the coupling circuit 200 via the driving unit 110, where the second input signal and the first input signal are 180 degrees out of phase, and other parameters are the same. For example, the two input signals can be output via the driving unit 110, the first input signal can be obtained by inverting a phase of the second input signal by 180 degrees, then the first input signal is input to the cancellation circuit 120, and the second input signal is input to the coupling circuit 200, but an embodiment of the present application is not limited to this.

In the embodiment of the present application, the coupling circuit 200 may include a variable capacitance component Cs; and the variable capacitance component Cs can be equivalent to a capacitor with variable capacitance. Specifically, the variable capacitance component Cs may include a first electrode layer and a second electrode layer; a distance between the first electrode layer and the second electrode layer can change. For example, the distance between the first electrode layer and the second electrode layer may change, when the first electrode layer is subjected to the touch pressure. Similarly, a capacitance value of the variable capacitance component Cs changes with a change of the distance between the first electrode layer and the second electrode layer.

Optionally, when the variable capacitance component Cs of the coupling circuit 200 is not subjected to the touch pressure, magnitude of capacitance of the variable capacitance component Cs is equal to that of the preset capacitor Cc of the cancellation circuit 120, that is, the magnitude of the capacitance of the preset capacitor Cc of the cancellation circuit 120 can be set to be approximately equal to magnitude of the capacitance of the variable capacitance component Cs of the coupling circuit 200 when it is not subjected to the touch pressure. It should be understood that equalities of the above two capacitance values may be approximately equal, such that the first input signal passing through the preset capacitor Cc of the cancellation circuit 120 can cancel all or most of the second input signal passing through the variable capacitance component Cs of the coupling circuit 200, when the variable capacitance component Cs of the coupling circuit 200 is not subjected to the touch pressure.

Figure 3:
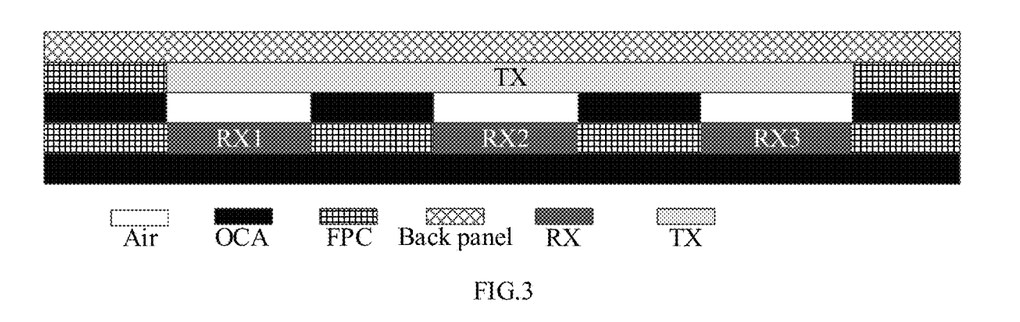
FIG. 3 is a schematic diagram of a stack of a pressure detection apparatus according to one embodiment of present application.

FIG. 3 shows a schematic diagram of a stack of a pressure detection apparatus according to one embodiment of present application. Specifically, taking FIG. 3 as an example, it is assumed that the pressure detecting circuit shown in FIG. 2 is located in a pressure detection apparatus shown in FIG. 3. For example, the pressure detection apparatus shown in FIG. 3 may be a terminal device or located in the terminal device. For example, the terminal device may be a mobile phone, and the stack of the pressure detection apparatus from top to bottom may be shown as FIG. 3, where a first layer may be a back panel of a display screen of a mobile phone. When a surface of the display screen is subjected to a touch pressure, the touch pressure is transmitted to a second layer through the back panel of the display screen, and the touch pressure can be a pressure generated when a user's finger presses the display screen. The second layer is an emitter electrode conductor Tx, which can be configured to transmit an electrical signal, the second layer can be equivalent to a first electrode layer of a variable capacitance component Cs in a coupling circuit 200 in the pressure detecting circuit, and the transmitted electrical signal is a second input signal. A third layer is an Optically Clear Adhesive (OCA) and air, and the OCA is configured to isolate and support the second layer and a fourth layer. When the pressure on the screen surface is transmitted to the second layer, the OCA and the air can digest the pressure and play the function of contracting space. The fourth layer is a receiving electrode conductor Rx, which can be regarded as a second electrode layer of the variable capacitance component Cs in the coupling circuit 200. The fourth layer forms the variable capacitance component Cs in the coupling circuit 200 with the second layer. The fourth layer can be configured to receive the electrical signal transmitted by the emitter electrode Tx of the second layer. Correspondingly, the electrical signal output by the fourth layer is a second output signal. A fifth layer is system ground of the mobile phone, configured to shield an interference signal below from entering a detecting circuit Rx.

Optionally, the fourth layer may further include a Flexible Printed Circuit (FPC).

It should be understood that magnitude and thickness of each layer in FIG. 3 are not limited herein. For example, the fourth layer in FIG. 3 includes four receiving electrode conductors Rx whose magnitude may be larger or smaller than that shown in FIG. 3. For example, magnitude of Rx1 may be greater than or less than or equal to that of a corresponding air gap of an upper layer. In general, each receiving electrode conductors Rx has a same magnitude and a uniform distribution.

It should be understood that as for interference, since there is a ground layer under the fourth layer, and there is the second layer above as a shield, strong interference can be resisted, such as charger interference, etc.

In the embodiment of the present application, as shown in FIG. 2 and FIG. 3, corresponding to the coupling circuit 200, the second input signal is input to the emitter electrode conductor Tx on the second layer, via the variable capacitance component Cs in the coupling circuit 200, and the second output signal is output to an input end of an amplifying circuit 140 by the fourth layer. In addition, corresponding to the cancellation circuit 120, the second input signal is also connected to the input end of the amplifying circuit 140 via the preset capacitor Cc, where the second input signal of the coupling circuit 200 and the second input signal of the cancellation circuit 120 are 180 degrees out of phase.

Thus, the pressure detection chip of the embodiment of the present application could cancel most or all of the signals of the coupling circuit by setting the cancellation circuit when there is no touch pressure applied; as such if there is the touch pressure applied, and an amplification factor of the amplifier is unchanged, due to a cancellation effect of the cancellation circuit, an effective signal output by the coupling circuit could be multiplied, that is, the detection sensitivity is improved, so that the pressure detection is more accurate.

Figure 4:
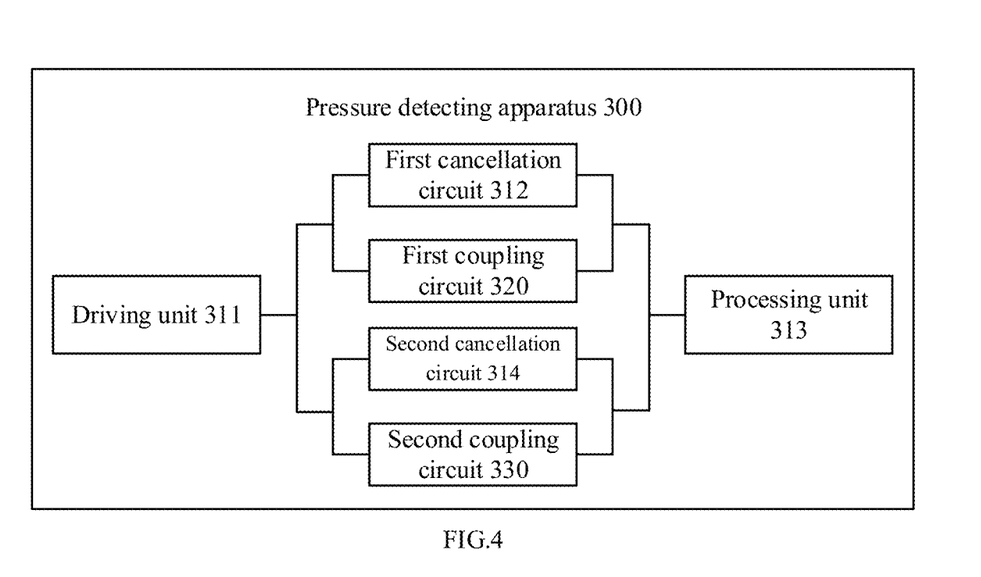
FIG. 4 is a schematic diagram of a pressure detection apparatus according to one embodiment of the present application.

FIG. 4 shows a schematic diagram of a pressure detection apparatus 300 according to one embodiment of the present application. The pressure detection apparatus 300 may include a pressure detection chip and at least one coupling circuit, where the pressure detection chip includes a driving unit 311, at least one cancellation circuit, and a processing unit 313. The at least one cancellation circuit includes a first cancellation circuit 312, and optionally can further include a second cancellation circuit 314, where the second cancellation circuit 314 can be any cancellation circuit other than the first cancellation circuit 312. The at least one coupling circuit includes a first coupling circuit 320, and optionally can further include a second coupling circuit 330, where the second coupling circuit 330 can be any coupling circuit other than the first coupling circuit 320. The first coupling circuit 320 is connected in parallel with the first cancellation circuit 312, and the second coupling circuit 330 is connected in parallel with the second cancellation circuit 314. Specifically, the pressure detection chip can be the pressure detection chip 100 as shown in FIG. 1 or FIG. 2. The driving unit 311 corresponds to a driving unit 110, and the first cancellation circuit 312 or the second cancellation circuit 314 corresponds to a cancellation circuit 120. Correspondingly, the first coupling circuit 320 or the second coupling circuit 330 corresponds to a coupling circuit 200, and the processing unit 313 corresponds to a processing unit 130.

The coupling circuit 320 may further include a variable capacitance component; and the variable capacitance component can be equivalent to a capacitor. The variable capacitance component includes a first electrode layer and a second electrode layer, and a distance between the first electrode layer and the second electrode layer may change when the first electrode layer is subjected to a touch pressure. Similarly, a capacitance value of the variable capacitance component changes with a change of the distance between the first electrode layer and the second electrode layer.

Specifically, the driving unit 311 is configured to: output the first input signal to the first cancellation circuit 312 which then output a first output signal, and output a second input signal to the second coupling circuit 320 which then output a second output signal, where the first input signal and the second input signal are 180 degrees out of phase, and the first output signal is configured to cancel the second output signal. For example, the first output signal can be used to cancel all or almost all of the second output signal when the first electrode layer is not subjected to the touch pressure. The processing unit 313 is configured to: determine whether the first electrode layer of the second coupling circuit 320 is subjected to the touch pressure according to the first output signal and the second output signal.

In the embodiment of the present application, the processing unit 313 can be specifically configured to: determine the first electrode layer is not subjected to the touch pressure if a difference signal between the first output signal and the second output signal is less than or equal to a first preset value.

Correspondingly, the processing unit 313 can further be configured to: determine the first electrode layer is subjected to the touch pressure if the difference signal between the first output signal and the second output signal is greater than the first preset value.

Specifically, when the pressure detection apparatus is subjected to the touch pressure, for example, the first electrode layer of the variable capacitance component of the first coupling circuit 320 in the pressure detection apparatus is subjected to the touch pressure, the second output signal may change compared with that when the pressure detection apparatus is not subjected to the touch pressure. Thus, when it is not subjected to the touch pressure, the first input signal of the first cancellation circuit 312 may completely cancel or almost completely cancel the second output signal, that is, it can be detected that the difference signal between the first output signal and the second output signal is less than or equal to the first preset value; and when it is subjected to the touch pressure, the first output signal of the first cancellation circuit 312 cannot completely cancel the second output signal, then it can be detected that the difference signal between the first output signal and the second output signal is greater than the first preset value.

However, considering the problems of temperature drift and common mode interference during a pressure detecting process may affect the accuracy of a detection result, an auxiliary circuit may be provided in the pressure detection apparatus, that is, a plurality of coupling circuits and cancellation circuits are included.

Specifically, the pressure detection apparatus may include a plurality of cancellation circuits and a plurality of coupling circuits, where the plurality of coupling circuits include the first coupling circuit 320 and the second coupling circuit 330, and the plurality of cancellation circuits include the first cancellation circuit 312 and the second cancellation circuit 314. For example, the first coupling circuit 320 and the first cancellation circuit 312 can be the coupling circuit 200 and the cancellation circuit 120 as shown in FIG. 1 or FIG. 2, and the second coupling circuit 330 and the second cancellation circuit 314 can also be the coupling circuit 200 and the cancellation circuit 120 as shown in FIG. 1 or FIG. 2. However, the first coupling circuit and the second coupling circuit are set at different positions. For example, as shown in FIG. 3, Rx1, Rx2, and Rx3 can respectively correspond to positions of three coupling circuits. Specifically, the Rx1, Rx2, and Rx3 can respectively correspond to the second electrode plate of the three coupling circuits.

It is assumed that a difference signal between the first output signal output by the first cancellation circuit 312 and the second output signal output by the first coupling circuit 320 is referred to as a first difference signal, and a difference signal between an output signal output by the second cancellation circuit 314 and an output signal output by the second coupling circuit 330 is referred to as a second difference signal. It is assumed that the first difference signal is greater than or equal to the second difference signal.

Thus, the processing unit 313 is further configured to: determine the first electrode layer is not subjected to the touch pressure if the first difference signal is greater than the first preset value, and the difference signal between the first different signal and the second different signal is less than or equal to a second preset value; or determine the first electrode layer is subjected to the touch pressure if the first difference signal is greater than the first preset value, and the difference signal between the first difference signal and the second difference signal is greater than the second preset value.

As such, a detected output result of the coupling circuit, which may be subjected to the touch pressure, is compared with an output result of the other coupling circuits. An error caused by temperature drift and common mode interference can be eliminated, and it can be determined more accurately whether the pressure detection apparatus is subjected to the touch pressure.

Figure 5:
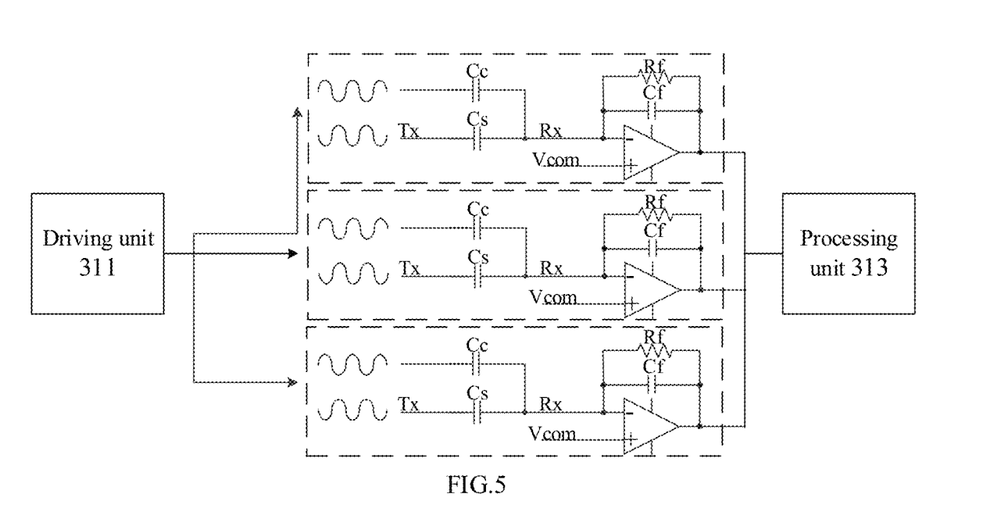
FIG. 5 is another schematic diagram of a pressure detection apparatus according to one embodiment of the present application.

Specifically, FIG. 5 shows another schematic diagram of a pressure detection apparatus according to one embodiment of the present application. As shown in FIG. 5, here the pressure detection apparatus including three sets of coupling circuits and cancellation circuits is taken an example for illustration. For ease of explanation, a set of coupling circuit and cancellation circuit connected in parallel is referred to herein as a pressure detecting circuit, that is, a dotted box in FIG. 5. FIG. 5 shows three pressure detecting circuits collectively, where any one pressure detecting circuit of the three pressure detecting circuits includes a coupling circuit and a cancellation circuit, the coupling circuit and the cancellation circuit can correspond to the first coupling circuit 320 and the first cancellation circuit 312 as shown in FIG. 4, or can also correspond to the coupling circuit 200 and the cancellation circuit 120 as shown in FIG. 1 and FIG. 2. Similarly, the rest two pressure detecting circuits shown in FIG. 5 can also correspond to the coupling circuit and the cancellation circuit as shown in FIGS. 1, 2 and 4. Here it is assumed that the first pressure detecting circuit is a combination of the first coupling circuit 320 and the first cancellation circuit 312 as shown in FIG. 4, and it is assumed that the first pressure detecting circuit detects a pressure, that is, the first pressure detecting circuit may be subjected to a touch pressure. So that the other two pressure detecting circuits are used as the auxiliaries to eliminate temperature drift and common mode interference. For example, any one of the two pressure detecting circuits is arbitrarily selected as an auxiliary, compared with the first pressure detecting circuit, it can be determined whether there is the temperature drift or the common mode interference, and further determined whether the first pressure detecting circuit is subjected to the touch pressure; or both the two pressure detecting circuits are used as auxiliary, for example, an average value of the two pressure detecting circuits can be taken, and compared with the first pressure detecting circuit, it can be determined whether it is subjected to the touch pressure, but the embodiment of the present application is not limited thereto.

It should be understood that each pressure detecting circuit can further include an amplifying circuit. An input end of the amplifying circuit connects to the coupling circuit of the pressure detecting circuit and an output end of the cancellation circuit. The amplifying circuit is configured to amplify output signals of the coupling circuit and the cancellation circuit. It can be determined whether a first electrode layer of a variable capacitance component in the coupling circuit is subjected to the touch pressure according to the amplified result.

Optionally, the amplifying circuit may include an amplifier, and may further include other relative circuits, but an embodiment of the present application is not limited to this.

Specifically, a driving unit 311 outputs first input signals to the cancellation circuit of each pressure detecting circuit, and outputs second input signals to the coupling circuit of each pressure detecting circuit. The first input signal can be obtained by inverting a phase of the second input signal by 180 degrees. Each pressure detecting circuit can transmit output results to a processing unit 313, and the processing unit 313 compares measurement results of various pressure detecting circuits to determine whether they are subjected to the touch pressure. For example, it can be determined which pressure detecting circuit detects the touch pressure.

It should be understood that the first preset value and the second preset value can be set according to an actual application. The first preset value can be equal to the second preset value, for example, both are set to 0; or the first preset value may be not equal to the second preset value, but the embodiment of the present application is not limited thereto.

It should be understood that the driving unit 311 of the embodiment of the present application may include a digital to analog converter (DAC), to convert a digital signal into an analog signal and input to the coupling circuit and the cancellation circuit of each pressure detecting circuit, but the embodiment of the present application is not limited thereto.

It should be understood that the processing unit 313 of the embodiment of the present application may collect pressure signal data. Specifically, the processing unit may include an analog to digital converter (ADC), to convert an analog signal into a digital signal. The processing unit 313 may include a micro control unit (MCU), which can collect and process the digital signal to determine whether the pressure detection apparatus is subjected to the touch pressure. The processing unit can further determine a pressure characteristic of the touch pressure if it is determined to be subjected to the touch pressure. For example, the pressure characteristic may include magnitude of the touch pressure, or duration of the touch pressure, etc., but the embodiment of the present application is not limited thereto.

It should be understood that the pressure detection apparatus 300 in the embodiment of the present application can be located in a terminal device, and when the pressure detection apparatus 300 determines that the touch pressure is detected, the terminal device may be triggered a corresponding target event, and further perform a target operation. Specifically, if the pressure detection apparatus 300 determines that the touch pressure is detected, the terminal device may determine the corresponding target event according to the pressure characteristic, trigger the target event, and perform the target operation. For example, when the detection apparatus 300 detects the touch pressure, the terminal device performs an operation of unlocking a home screen, or the terminal device can further perform an operation according to the touch pressure action time, to return to the home page for a short-time touch, and to lock the screen for a long-time touch.

Thus, the pressure detection apparatus of the embodiment of the present application may include the cancellation circuit, and cancel most or all of the signals of the corresponding coupling circuit when there is no touch pressure applied; as such if there is the touch pressure applied, and an amplification factor of the amplifier is unchanged, due to a cancellation effect of the cancellation circuit, an effective signal output by the coupling circuit could be multiplied, that is, the detection sensitivity is improved, so that the pressure detection is more accurate. In addition, a pressure detection apparatus of the embodiment of the present application implements pressure detection by applying a micro capacitance detecting technology, which in principle belongs to the same type of signal detecting technology as the widely used capacitive touch detection at present, and could be reused with a capacitive touch IC. It could save both internal space of a mobile phone and financial costs.

Moreover, the pressure detection apparatus may include a plurality of pressure detecting circuits. Each pressure detecting circuit includes the coupling circuit and the cancellation circuit. The plurality of pressure detecting circuits could simultaneously detect a pressure signal, part of which could be used as an auxiliary to determine temperature drift and anti-interference processing, and could greatly improve application performance.

Figure 6:
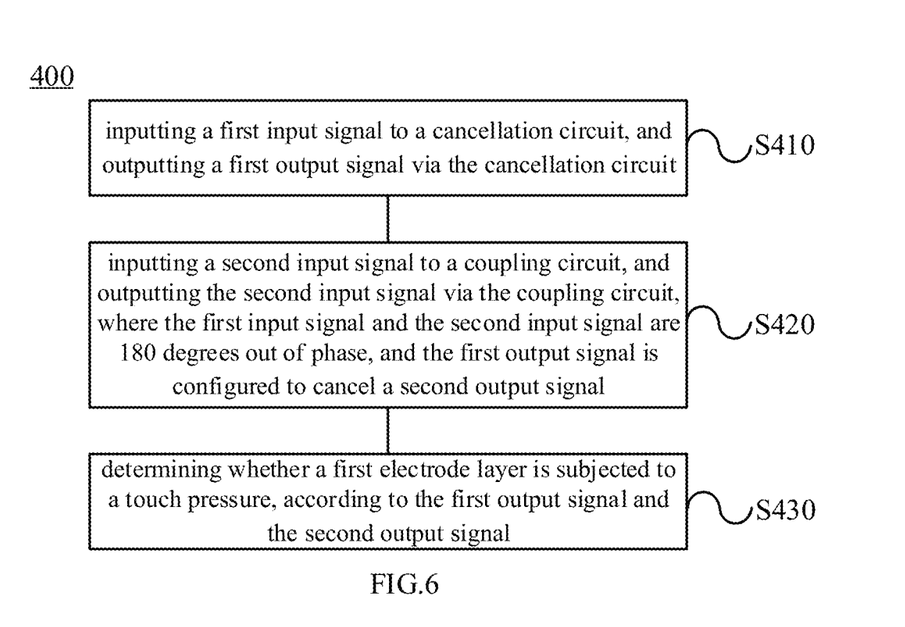
FIG. 6 is a schematic flowchart of a method for detecting pressure according to one embodiment of the present application.

FIG. 6 shows a schematic flowchart of a method 400 for detection pressure according to one embodiment of the present application. The method 400 may be performed by a pressure detection apparatus. For example, the pressure detection apparatus can be the pressure detection apparatus 300 as shown in FIG. 4 or FIG. 5. The pressure detection apparatus include a cancellation circuit and a coupling circuit, where the cancellation circuit is connected in parallel with the coupling circuit; the coupling circuit includes a variable capacitance component; the variable capacitance component includes a first electrode layer and a second electrode layer; a distance between the first electrode layer and the second electrode layer changes when the first electrode layer is subjected to a touch pressure; a capacitance value of the variable capacitance component changes with a change of the distance between the first electrode layer and the second electrode layer.

As shown in FIG. 6, the method 400 includes: S410, inputting a first input signal to the cancellation circuit, and outputting a first output signal via the cancellation circuit; S420, inputting a second input signal to the coupling circuit, and outputting a second input signal via the coupling circuit, where the first input signal and the second input signal are 180 degrees out of phase, and the first output signal is configured to cancel the second output signal; and S430, determining whether the first electrode layer is subjected to a touch pressure, according to the first output signal and the second output signal.

Optionally, the cancellation circuit includes a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

Optionally, before the determining whether the first electrode layer is subjected to the touch pressure according to the first output signal and the second output signal, the method further includes: amplifying the first output signal and the second output signal.

Optionally, the first input signal is obtained by inverting a phase of the second input signal by 180 degrees.

Optionally, the determining whether the first electrode layer is subjected to the touch pressure according to the first output signal and the second output signal, includes: determining the first electrode layer is not subjected to the touch pressure if a difference signal between the first input signal and the second output signal is less than or equal to a first preset value.

Optionally, the determining whether the first electrode layer is subjected to the touch pressure according to the first output signal and the second output signal, includes: determining the first electrode layer is subjected to the touch pressure if the difference signal between the first input signal and the second output signal is greater than the first preset value.

Optionally, the pressure detection apparatus further includes a second cancellation circuit and a second coupling circuit; the second cancellation circuit is connected in parallel with the second coupling circuit; an input signal of the second cancellation circuit and an input signal of the second coupling circuit are 180 degrees out of phase; and an output signal of the second cancellation circuit is configured to cancel an output signal of the second coupling circuit.

Optionally, a difference signal between the first output signal and the second output signal is a first difference signal, a different signal between the output signal of the second cancellation circuit and the output signal of the second coupling circuit is a second difference signal, and the first difference signal is greater than or equal to the second difference signal; and the determining whether the first electrode layer is subjected to the touch pressure according to the first output signal and the second output signal, includes: determining the first electrode layer is not subjected to the touch pressure if the first difference signal is greater than the first preset value, and the difference signal between the first different signal and the second different signal is less than or equal to a second preset value; or determining the first electrode layer is subjected to the touch pressure if the first difference signal is greater than the first preset value, and the difference signal between the first difference signal and the second difference signal is greater than the second preset value.

Optionally, the method further includes: determining a pressure characteristic of the touch pressure, if determining that the first electrode layer is subjected to the touch pressure.

Thus, the method for detection pressure of the embodiment of the present application sets the cancellation circuit in the pressure detection apparatus. Most or all of the signals of the coupling circuit could be cancelled when there is no touch pressure applied; as such if there is the touch pressure applied, and an amplification factor of the amplifier is unchanged, due to a cancellation effect of the cancellation circuit, an effective signal output by the coupling circuit could be multiplied, that is, the detection sensitivity is improved, so that the pressure detection is more accurate. In addition, a pressure detection apparatus of the embodiment of the present application implements pressure detection by applying a micro capacitance detecting technology, which in principle belongs to the same type of signal detecting technology as the widely used capacitive touch detection at present, and could be reused with a capacitive touch IC. It could save both internal space of a mobile phone and financial costs.

Moreover, the pressure detection apparatus may include a plurality of pressure detecting circuits. Each pressure detecting circuit includes the coupling circuit and the cancellation circuit. The plurality of pressure detecting circuits could simultaneously detect a pressure signal, part of which could be used as an auxiliary to determine temperature drift and anti-interference processing, and could greatly improve application performance.

Those of ordinary skill in the art may be aware that, units and algorithm steps of the examples described in the embodiments disclosed in this paper may be implemented by electronic hardware, computer software, or a combination of the two. Whether these functions are performed by hardware or software depends on particular applications and designed constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that, the disclosed system, apparatus and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate components may or may not be physically separate, and components displayed as units may or may not be physical units, may be located in one position, or may be distributed on multiple network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such understanding, the technical solutions of the present application substantially, or the part of the present disclosure making contribution to the prior art, or a part of the technical solution may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present application. The foregoing storage medium includes a variety of media capable of storing program codes, such as a USB disk, a mobile hard disk, a read-only memory (Read-Only Memory, ROM), a random access memory (Random Access Memory, RAM), a magnetic disk, an optical disk.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A pressure detection apparatus, comprising: a pressure detection chip and a first coupling circuit, wherein:
   the pressure detection chip comprises a first cancellation circuit, a driving unit, and a processing unit,
   the first cancellation circuit is connected in parallel with the first coupling circuit, the first coupling circuit comprises a variable capacitance component; the variable capacitance component comprises a first electrode layer and a second electrode layer, a distance between the first electrode layer and the second electrode layer changes when the first electrode layer is subjected to a touch pressure, a capacitance value of the variable capacitance component changes with a change of the distance between the first electrode layer and the second electrode layer;
   the driving unit is configured to output a first input signal to the first cancellation circuit, and output a second input signal to the first coupling circuit;
   the first cancellation circuit is configured to receive the first input signal and output a first output signal;
   the first coupling circuit is configured to receive the second input signal and output a second output signal, wherein the first input signal and the second input signal are 180 degrees out of phase, and the first output signal is configured to cancel the second output signal; and
   the processing unit is configured to determine whether the first electrode layer is subjected to the touch pressure according to the first output signal and the second output signal;
   wherein the processing unit is configured to:
   determine the first electrode layer is not subjected to the touch pressure if a difference signal between the first input signal and the second output signal is less than or equal to a first preset value; or
   determine the first electrode layer is subjected to the touch pressure if the difference signal between the first input signal and the second output signal is greater than the first preset value.

2. The pressure detection apparatus according to claim 1, wherein the first cancellation circuit comprises a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

3. The pressure detection apparatus according to claim 2, wherein the pressure detection chip further comprises: an amplifying circuit; both an output end of the first cancellation circuit and an output end of the first coupling circuit connect to an input end of the amplifying circuit; and the amplifying circuit is configured to amplify the first output signal and the second output signal.

4. The pressure detection apparatus according to claim 3, wherein the first input signal is obtained by inverting a phase of the second input signal by 180 degrees.

5. The pressure detection apparatus according to claim 1, wherein the pressure detection chip further comprises: an amplifying circuit; both an output end of the first cancellation circuit and an output end of the first coupling circuit connect to an input end of the amplifying circuit; and the amplifying circuit is configured to amplify the first output signal and the second output signal.

6. The pressure detection apparatus according to claim 1, wherein the first input signal is obtained by inverting a phase of the second input signal by 180 degrees.

7. The pressure detection apparatus according to claim 1, wherein the processing unit is configured to:
  determine a pressure characteristic of the touch pressure, if it determines that the first electrode layer is subjected to the touch pressure, wherein the pressure characteristic comprises magnitude of the touch pressure duration of the touch pressure.

8. A pressure detection apparatus, comprising: a pressure detection chip and a first coupling circuit, wherein:
  the pressure detection chip comprises a first cancellation circuit, a driving unit, and a processing unit,
  the first cancellation circuit is connected in parallel with the first coupling circuit, the first coupling circuit comprises a variable capacitance component the variable capacitance component comprises a first electrode layer and a second electrode layer, a distance between the first electrode layer and the second electrode layer changes when the first electrode layer is subjected to a touch pressure, a capacitance value of the variable capacitance component changes with a change of the distance between the first electrode layer and the second electrode layer;
  the driving unit is configured to output a first input signal to the first cancellation circuit, and output a second input signal to the first coupling circuit;
  the first cancellation circuit is configured to receive the first input signal and output a first output signal;
  the first coupling circuit is configured to receive the second input signal and output a second output signal, wherein the first input signal and the second input signal are 180 degrees out of phase, and the first output signal is configured to cancel the second output signal; and
  the processing unit is configured to determine whether the first electrode layer is subjected to the touch pressure according to the first output signal and the second output signal;
  wherein the pressure detection chip further comprises a second cancellation circuit the pressure detection apparatus further comprises a second coupling circuit the second cancellation circuit is connected in parallel with the second coupling circuit an input signal of the second cancellation circuit and an input signal of the second coupling circuit are 180 degrees out of phase; and an output signal of the second cancellation circuit is configured to cancel an output signal of the second coupling circuit;
  wherein a difference signal between the first output signal and the second output signal is a first difference signal, a different signal between the output signal of the second cancellation circuit and the output signal of the second coupling circuit is a second difference signal, and the first difference signal is greater than or equal to the second difference signal;
  the processing unit is configured to:
  determine the first electrode layer is not subjected to the touch pressure if the first difference signal is greater than a first preset value, and a difference signal between the first different signal and the second different signal is less than or equal to a second preset value; or
  determine the first electrode layer is subjected to the touch pressure if the first difference signal is greater than the first preset value, and the difference signal between the first difference signal and the second difference signal is greater than the second preset value.

9. The pressure detection apparatus according to claim 8, wherein the first cancellation circuit comprises a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

10. The pressure detection apparatus according to claim 8, wherein the pressure detection chip further comprises: an amplifying circuit; both an output end of the first cancellation circuit and an output end of the first coupling circuit connect to an input end of the amplifying circuit; and the amplifying circuit is configured to amplify the first output signal and the second output signal.

11. The pressure detection apparatus according to claim 10, wherein the pressure detection chip further comprises: an amplifying circuit; both an output end of the first cancellation circuit and an output end of the first coupling circuit connect to an input end of the amplifying circuit; and the amplifying circuit is configured to amplify the first output signal and the second output signal.

12. The pressure detection apparatus according to claim 11, wherein the first input signal is obtained by inverting a phase of the second input signal by 180 degrees.

13. The pressure detection apparatus according to claim 8, wherein the first input signal is obtained by inverting a phase of the second input signal by 180 degrees.

14. The pressure detection apparatus according to claim 8, wherein the processing unit is configured to:
  determine a pressure characteristic of the touch pressure, if it determines that the first electrode layer is subjected to the touch pressure, wherein the pressure characteristic comprises magnitude of the touch pressure duration of the touch pressure.

15. A method for pressure detection performed by a pressure detection apparatus, wherein the pressure detection apparatus comprises a cancellation circuit and a coupling circuit, the cancellation circuit is connected in parallel with the coupling circuit, the coupling circuit comprises a variable capacitance component, the variable capacitance component comprises a first electrode layer and a second electrode layer, a distance between the first electrode layer and the second electrode layer changes when the first electrode layer is subjected to a touch pressure, a capacitance value of the variable capacitance component changes with a change of the distance between the first electrode layer and the second electrode layer, the method comprises:

inputting a first input signal to the cancellation circuit, and outputting a first output signal via the cancellation circuit;

inputting a second input signal to the coupling circuit, and outputting a second output signal via the coupling circuit, wherein the first input signal and the second input signal are 180 degrees out of phase, and the first output signal is configured to cancel the second output signal; and determining whether the first electrode layer is subjected to the touch pressure according to the first output signal and the second output signal;

wherein the determining whether the first electrode layer is subjected to the touch pressure according to the first output signal and the second output signal, comprises:

determining the first electrode layer is not subjected to the touch pressure if a difference signal between the first input signal and the second output signal is less than or equal to a first preset value; or determining the first electrode layer is subjected to the touch pressure if the difference signal between the first input signal and the second output signal is greater than the first preset value.

16. The method according to claim 15, wherein the cancellation circuit comprises a preset capacitor; capacitance of the preset capacitor is equal to initial capacitance of the variable capacitance component; and the initial capacitance is equivalent capacitance between the first electrode layer and the second electrode layer when the first electrode layer is not subjected to the touch pressure.

17. The method according to claim 16, wherein before the determining whether the first electrode layer is subjected to the touch pressure according to the first output signal and the second output signal, the method further comprises:

amplifying the first output signal and the second output signal.

18. The method according to claim 15, wherein before the determining whether the first electrode layer is subjected to the touch pressure according to the first output signal and the second output signal, the method further comprises:

amplifying the first output signal and the second output signal.

19. The method according to claim 15, wherein the first input signal is obtained by inverting a phase of the second input signal by 180 degrees.

20. The method according to claim 15, further comprising:

determining a pressure characteristic of the touch pressure, if determining that the first electrode layer is subjected to the touch pressure, wherein the pressure characteristic comprised magnitude of the touch pressure duration of the touch pressure.

* * * * *